United States Patent

Beasley et al.

[11] Patent Number: 5,593,604
[45] Date of Patent: Jan. 14, 1997

[54] METHOD OF RESISTANCE WELDING THIN ELEMENTS

[75] Inventors: Jeff Beasley, Buford; Michael B. Kirschner, Alpharetta; Robert A. Charles, Chamblee; Sacha C. Hall, Atlanta, all of Ga.

[73] Assignee: Motorola, Inc., Schaumburg, Ill.

[21] Appl. No.: 434,632

[22] Filed: May 4, 1995

[51] Int. Cl.⁶ ..................... B23K 11/11
[52] U.S. Cl. .......... 219/117.1; 219/56.1; 219/56.22; 219/86.9; 219/87; 219/91.21
[58] Field of Search .............. 219/56.1, 56.22, 219/86.1, 86.9, 87, 91.2, 117.1

[56] References Cited

U.S. PATENT DOCUMENTS

| | | | |
|---|---|---|---|
| 2,137,909 | 11/1938 | Hagedorn | 219/86.9 |
| 2,300,700 | 11/1942 | Porter et al. | 219/86.9 |
| 3,231,710 | 1/1966 | Barnet et al. | 219/56.22 |
| 3,284,606 | 11/1966 | Schroeppel | 219/86.9 |
| 3,462,577 | 8/1969 | Helms et al. | 218/86.9 |
| 3,478,190 | 11/1969 | Dawes | 219/86.9 |
| 4,920,019 | 4/1990 | Stoklosa et al. | 429/122 |
| 5,298,712 | 3/1994 | Alexandres | 219/117.1 |

*Primary Examiner*—Geoffrey S. Evans
*Assistant Examiner*—J. Pelham
*Attorney, Agent, or Firm*—Scott M. Garrett

[57] ABSTRACT

A battery pack (30) is assembled with a flexible circuit board (38), a first tab (40), and a second tab (42). The flexible circuit board (38) has an exposed area of isolated conductor (46) which is located directly under the intersection of the first tab (40) and the second tab (42), a point where the two are resistance welded together (44). When a weld current is applied at this point (44), the isolated conductor area (46) acts as a current sink such that current flows primarily through the second (lower) tab (42). This method allows both tabs or elements to be of the same or similar thickness and electrical properties, and facilitates automated battery pack assembly.

6 Claims, 2 Drawing Sheets

5,593,604

METHOD OF RESISTANCE WELDING THIN ELEMENTS

TECHNICAL FIELD

This invention relates in general to battery packs and more particularly to assembly of battery packs by resistance welding.

BACKGROUND

Resistance welding is a common method of joining two metal pieces. This is certainly true in the assembly of electrical apparatuses such as battery packs where metal tab stock material is welded to the battery cells and to other tab pieces to create the necessary electrical interconnections. Tab stock is typically supplied on spools and cut in the factory to a specified length to make individual tabs. In general, tabs are used to electrically interconnect various parts of electrical apparatuses, and are typically steel or nickel alloys formed into a generally ribbon shaped, or an otherwise thin element.

The welding process involves contacting a pair of electrodes with the metal work pieces, in this case tabs, and while they are pressed together, passing a high level electrical current pulse between the electrodes. The current distributes through the work pieces between the two electrodes, and is most dense where the electrodes contact the work piece(s). The resistance of the metal creates heating, and because of the high power of the current pulse, the metal heats in the particular localized area between the electrodes so much that the two pieces are joined where the weld current density is highest, i.e. directly under, or between the electrodes. This is why the two pieces are pressed together. At that point, or points, what is commonly referred to as a weld nugget is produced. For the weld to be considered useful, the nugget(s) must have good mechanical strength and good electrical conductivity. There are basically two methods of resistance welding, pinch or series welding, and parallel welding.

Pinch welding involves pressing the two work pieces together from opposing side with the electrodes, and then applying the current pulse. This forces the current to travel through the interface point where the two pieces best contact each other because it provides a slightly lower resistance path. However, as the current heats up the metal at the point of compression, the path originally offering the lowest resistance heats, and increases slightly in resistance. The current starts the weld event mostly conducting through the shortest point of compression, but is continuously distributed away from the initial point as the metal heats. This causes the current density profile through the compression point to change throughout the weld event, and thus provides a single evenly welded nugget.

Parallel welding produces a pair of weld nuggets. It involves laying a first work piece over a second work piece, and applying the electrodes to the exposed side of the first piece, thereby compressing the two pieces together at two points. To produce the two weld nuggets, current must travel down from the first electrode through the first piece and the first interface point, through the second piece to the second interface point, up through the second interface point into the first piece, and into the second electrode. This method of welding requires more sophistication compared to pinch welding to produce an acceptable weld.

In pinch welding, the current must travel through the interface point to get from one electrode to the other. In parallel welding the current must have some incentive to travel through the second work piece to produce the necessary nugget integrity. This is accomplished by making the second work piece a less resistive path. There are three ways this can be achieved. First, assuming similar mechanical cross sectional areas of the two work pieces, one may make the second piece a different material than the first, such that the second piece has an inherently lower resistance. Second, assuming similar resistive characteristics of the two work pieces, increase the cross sectional area of the second work piece. Third, similar to the second, artificially decrease the resistance of the second work piece by applying a third work piece to the back of the second work piece. By adding a third work piece, the first and second solutions can be combined.

The third option is the most preferred method in the manufacture of electrical apparatuses because it facilitates rapid assembly. As such, many of the currently marketed electrical apparatuses preclude the use of pinch welding. This is due to their compact size and the added handling considerations of pinch welding, i.e., positioning two work pieces between the electrodes. To facilitate parallel welding of, for example, battery pack interconnect tabs, a metal disk, or "coin", is placed under the two tabs. After the weld operation is complete, the coin is removed and used for the next weld operation. Obviously the coin could be left under the tabs, but the incurred cost, and in the case of battery packs the increased weight, is marketably unacceptable. At the same time, although still easier to handle than a pinch weld operation, the coin method does not lend itself to automation, and limits production capability.

Therefore there is a need for a way to facilitate parallel resistance welding of thin elements without incurring cost or weight, and which accommodates automation and the rapid manufacture of electrical apparatuses.

DETAILED DESCRIPTION OF THE PREFERRED EMBODIMENT

Figure 1:
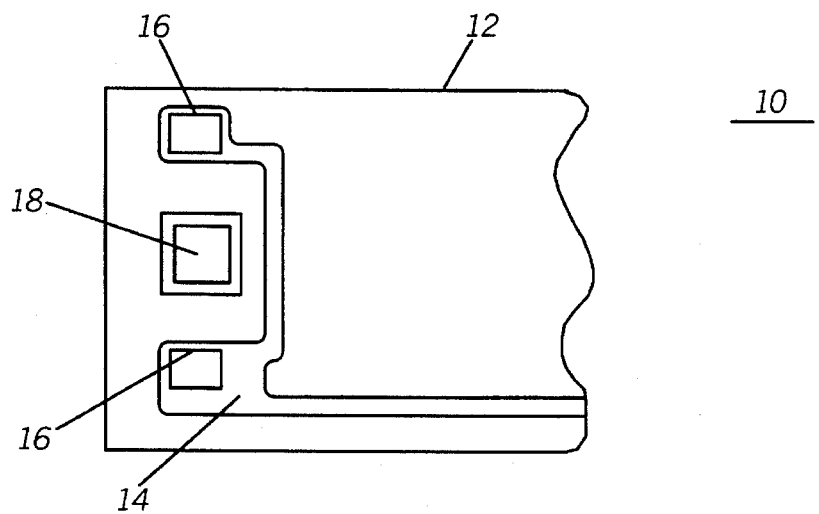
FIG. 1 is a top view of a portion of a flexible circuit board for an electronic apparatus in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated a top view of a portion 10 of a flexible circuit board 12, which is an integral structural member for an electronic device such as a battery pack. The flexible circuit board 12 is a laminate comprising a first insulating layer, a conductor layer having runner interconnects, and a second insulator layer. The first insulator layer can be fabricated with openings so that portions of the conducting layer are exposed, in a manner well known in the art. Various battery circuit components can then be soldered to the conductor layer runners to form a battery circuit. The conductor layer is typically made of copper which is etched away, leaving copper where runners are needed. FIG. 1 illustrates a power runner 14 for carrying current through the battery pack. The power runner 14 forms a pair of solder pads or pads 16. Although shown here connected to each other, it is contemplated that the pads may be isolated. The power runner 14 connects the pads 16, and whatever is subsequently soldered to the pads 16, to the battery circuit. Between the pads 16 is an electrically isolated region of conductor 18. Both the pads 16 and the isolated region of conductor 18 are exposed through openings in the first insulator layer.

Figure 2:
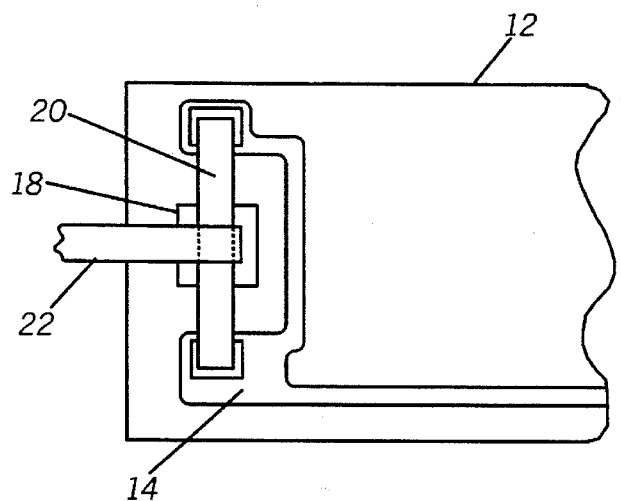
FIG. 2 is a top view of a portion of a flexible circuit board including a pair of tab interconnects to be welded together in accordance with the invention.

To illustrate how the weld process is significantly improved, the same portion of flexible circuit board shown in FIG. 1 is shown in FIG. 2 with the addition of interconnect tabs, which in general, are used to interconnect parts of an electrical apparatus. To provide a connection to another component such as the battery circuit, solder paste is deposited on the pads 16, and a first tab 20 of a length corresponding to the distance separating the pads 16 is placed on the solder paste. When heated, the first tab 20 becomes soldered between the pads and to the power runner 14. To connect, for example, battery cells to the battery circuit, a second tab 22 is placed over the first tab 20 such that the second tab 22 aligns with the isolated region of conductor 18. The flexible circuit board 12 is supported from beneath by at least one battery cell (not shown). Two weld electrodes (not shown) as are commonly used in parallel welding processes, are brought over the second tab 22 and press down upon it, thereby compressing the second tab 22, the first tab 20, and the isolated region of conductor 18 together. Upon applying weld current via the weld electrodes, the isolated region of conductor 18 acts as a thin current sink drawing the weld current through the first interface point (defined by tabs 20 and 22) until it is returned to the opposite electrode through the second interface point, thus creating the weld nuggets.

The isolated region of conductor 18 costs essentially nothing to add to the flexible circuit board 12. As mentioned previously, the conductor layer is formed by removing conductor to leave the necessary pattern. It adds virtually no weight to the battery pack, and it eliminates handling of a current sink such as the coin, thus facilitating automation and rapid battery pack manufacture.

Figure 3:
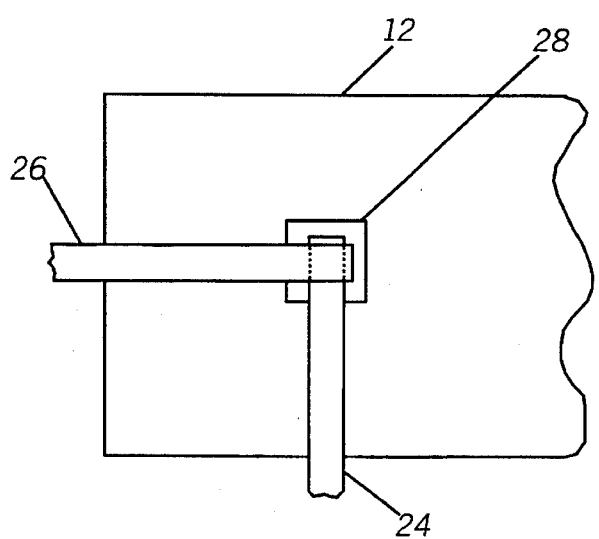
FIG. 3 is a top view of a portion of a flexible circuit board including a pair of tab interconnects in an alternate embodiment in accordance with the invention.

Referring now to FIG. 3, a top view of a portion of a flexible circuit board 12 for a battery pack including a pair of tab interconnects in an alternate embodiment in accordance with the invention. In addition to providing a current sink for the tab arrangement of FIG. 2, where one tab is soldered to the flexible circuit board, a current sink can also be provided where two tabs are welded together remote from any circuit board attachment. Here is shown a lower tab 24 between an upper tab 26 and an exposed integral current sink 28. The integral current sink 28 is substantially the same as the isolated region of conductor 18 in FIGS. 1 & 2. A difference being that neither the upper tab 26 or lower tab 24 are connected to the flexible circuit board 12 in the immediate region. Such L shaped weld connections are common in battery pack assembly, and it should be appreciated that other arrangements are similarly common.

Figure 4:
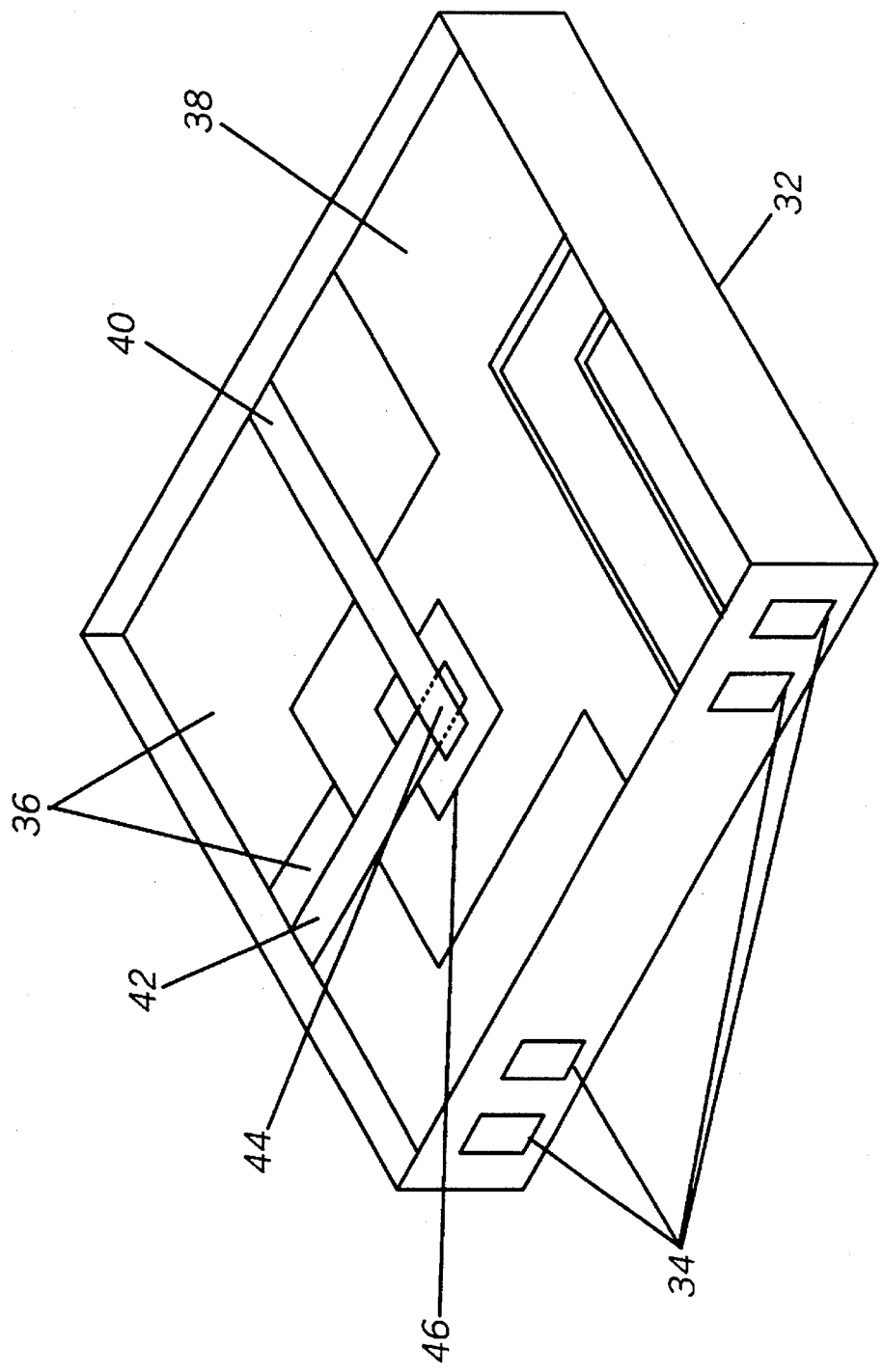
FIG. 4 is a perspective view of a partially assembled battery pack in accordance with the invention.

To illustrate how such an integral current sink facilitates assembly of an electrical apparatus, FIG. 4 is provided. Referring now to FIG. 4, a perspective view of a partially assembled battery pack generally referred to by reference numeral 30 is shown. The battery pack 30 comprises a battery housing 32, generally fabricated of plastic by injection molding. Located on the housing is at least two battery contacts and as shown in FIG. 4 the housing includes four battery contacts 34 for making an electrical connection with the battery cells 36. The contacts 34 also facilitate electrical contact with whatever battery circuitry is present in the battery pack.

The contacts are interconnected with the battery cells 36 and battery circuitry by a flexible circuit board 38. A first tab 40 and a second tab 42 connect battery cells 36 to the flexible circuit board, and may also be used to connect the battery cells 36 together to form a series connected cell pack. While shown as a substantial "L" shaped connection, it will be appreciated by those skilled in the art that numerous configurations for interconnect tabs are possible, and the arrangement shown here is only representative of one such configuration. The first tab 40 and second tab 42 meet at point 44, where they are joined by resistance welding. Provided at this same point on the flexible circuit board is an exposed conductor area 46 which is substantially a thin current sink adhered to one layer of the flexible circuit board. The tabs and exposed conductor area must be supported during the welding process, and are shown here supported by the battery cells 36. The thin current sink acts on weld current subsequently applied such that weld current is drawn more through the second tab 42 when weld electrodes are placed on the same side of first tab 40.

It will be appreciated by those skilled in the art that the current sink, while shown here as being provided on a flexible circuit board, can be provided on other integral structural members of an electrical apparatus assembled with similar weld operations. For example, a conductor could be plated or otherwise adhered onto a section of the battery housing 32. A pair of tabs to be welded together would be aligned directly over the conductor area such that upon applying a weld current pulse, the conductor area would act as a thin current sink. It is contemplated that this could be accomplished by the use of a thin foil sticker.

The method of resistance welding thin elements, such as tabs, described above simplifies the manufacture of an electrical apparatus such as a battery pack. The simplification comes from providing a thin current sink on an integral structural member of the electrical apparatus, such as a flexible circuit board, at an intersection point of two tabs in the electrical apparatus. Once the tabs and the flexible circuit board are in place, the tabs are aligned over the current sink, the weld electrodes are lowered into contact with the uppermost tab directly over the weld point, thereby compressing the tabs and the current sink together. Once sufficient compression is achieved, passing a weld current pulse between the electrodes forms a pair of weld nuggets at the interface points between the two tabs immediately under each electrode. The potential to automate assembly of such electrical apparatuses is increased by eliminating the use of manually handled coin type current sinks. In addition, the improvement does not increase the material cost of the electrical apparatus.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of resistance welding thin elements in an electrical apparatus, said electrical apparatus having an integral structural member and at least two tabs to electrically interconnect parts of said electrical apparatus, said method comprising the steps of:

providing a thin current sink adhered to said integral structural member;

aligning portions of said at least two tabs over said thin current sink;

compressing said at least two tabs against said thin current sink with a pair of weld electrodes; and applying a weld current pulse between said weld electrodes.

2. The method of claim 1, wherein the step of providing a thin current sink includes the step of providing said current sink adhered to a housing for said electrical apparatus.

3. The method of claim 1, wherein the step of providing a thin current sink includes the step of providing said current sink as an electrically isolated region of a flexible circuit board.

4. A method of resistance welding thin elements in a battery pack, said battery pack having a flexible circuit board, at least one battery cell, and a plurality of tabs for electrically interconnecting said at least one battery cell with said flexible circuit board, said method comprising the steps of:

providing a thin current sink adhered to said flexible circuit board;

aligning said at least two tabs over said thin current sink;

compressing two of said tabs together against said thin current sink with a pair of weld electrodes; and passing a weld current pulse between said weld electrodes.

5. A battery pack, comprising:

at least one battery cell;

a flexible circuit board having a circuit;

tabs for interconnecting said at least one battery cell to said flexible circuit board, said tabs intersecting thereby defining an intersection point; and wherein said flexible circuit board comprises at least one electrically isolated region of conductor adhered thereto and located underneath at least one of said intersection points.

6. The battery pack of claim 5, wherein one of said at least one electrically isolated region of conductor is disposed between a pair of pads, and a tab is soldered between said pads over said electrically isolated region of conductor, said pads electrically connected to said circuit.

* * * * *